United States Patent [19]
Batchelder

[11] Patent Number: 6,019,165
[45] Date of Patent: Feb. 1, 2000

[54] HEAT EXCHANGE APPARATUS

[76] Inventor: John Samuel Batchelder, 2 Campbell Dr., Somers, N.Y. 10589

[21] Appl. No.: 09/080,915

[22] Filed: May 18, 1998

[51] Int. Cl.[7] ........................................................ F28F 7/00
[52] U.S. Cl. ...................... 165/80.3; 165/80.4; 165/80.5; 165/104.33; 257/714; 317/234 R
[58] Field of Search ................................ 165/80.3, 80.4, 165/80.5, 104.33; 257/714; 317/234 R

[56] References Cited

U.S. PATENT DOCUMENTS

| | | |
|---|---|---|
| 1,819,528 | 8/1931 | Terry . |
| 3,654,528 | 4/1972 | Barkan ................................ 317/234 R |
| 4,519,447 | 5/1985 | Wiech ................................ 165/104.33 |
| 4,780,062 | 10/1988 | Yamada ................................... 417/322 |
| 5,001,548 | 3/1991 | Iversen ................................... 165/80.3 |
| 5,183,104 | 2/1993 | Novotny ............................. 165/104.33 |
| 5,203,399 | 4/1993 | Koizumi .............................. 165/104.33 |
| 5,316,077 | 5/1994 | Reichard ............................. 165/104.28 |
| 5,394,936 | 3/1995 | Budelman ........................... 165/104.33 |
| 5,731,954 | 3/1998 | Cheon ....................................... 361/699 |
| 5,763,951 | 6/1998 | Hamilton et al. ........................ 257/714 |

FOREIGN PATENT DOCUMENTS 4225676  2/1994  Germany .

*Primary Examiner*—Ira S. Lazarus
*Assistant Examiner*—Terrell McKinnon

[57] ABSTRACT

An apparatus to transfer heat from a heat source to a heat absorber, the apparatus consisting of an active thermal spreader plate with internal flow channels, a recirculating heat transfer fluid, and a means to impel the heat transfer fluid using an external moving magnetic field. In the most preferred embodiment a centripetal pump impeller is trapped inside the active thermal spreader plate, and the impeller is motivated to rotate due to eddy currents generated by the external moving magnetic fields.

35 Claims, 13 Drawing Sheets

HEAT EXCHANGE APPARATUS

BACKGROUND OF THE INVENTION

In 1981 Carver Mead pointed out that a computer is a thermodynamic engine that sucks entropy out of data, turns that entropy into heat, and dumps the heat into the room. Today our ability to get that waste heat out of semiconductor circuits and into the room at a reasonable cost limits the density and clock speed of those circuits.

Cooling technologies are available that can transport very high densities of waste heat For example the combined fluorocarbon and helium forced convection design described in U.S. Pat. No. 5,131,233 achieves a volumetric power transfer density which is much greater than what is expected for workstation microprocessors even through the year 2010. However, due to the complexity of this system, the cost to implement this system is orders of magnitude above the $5 per microprocessor targeted by Intel and the PC manufacturers.

A typical characteristic of heat transfer devices for electronics today is that the atmosphere is the final heat sink of choice. Air cooling gives manufactures access to the broadest market of applications. Another typical characteristic of heat transfer devices for electronics today is that the semiconductor chip thermally contacts a passive aluminum spreader plate, which conducts the heat from the chip to one of several types of fins; these fins convect heat to the atmosphere with natural or forced convection.

As the power to be dissipated by semiconductor devices increases with time, a problem arises: within about ten years the thermal conductivity of the available materials becomes too low to conduct the heat from the semiconductor device to the fins with an acceptably low temperature drop. The thermal power density emerging from the chip will be so high in ten years than even copper or silver spreader plates will not be adequate. A clear and desirable solution to this problem is to develop inexpensive ways to manufacture more exotic materials like pyrolitic graphite or diamond that have even higher thermal conductivities. If the cost of these exotic materials does not fall quickly enough, an alternative solution is needed, such as will be discussed shortly.

Heat can be transported by an intermediate loop of recirculating fluid; heat from the hot object is conducted into a heat transfer fluid, the fluid is pumped by some means to a different location, and there the heat is conducted out of the fluid into a fin means and finally into the atmosphere. Thermosiphons use a change in density of the heat transfer fluid to impel circulation of the fluid, while heat pipes and boiling fluorocarbon use a phase transition of the heat transfer fluid to impel circulation of the fluid. While these approaches have important cooling applications, their cost for implementation will have to be reduced to generally impact semiconductor cooling. It is our suspicion that extracting the power for moving the heat transfer fluid from the heat flow itself is not energetically warranted in systems which dissipate hundreds of watts of waste heat from a semiconductor chip, and which dissipate several watts of electrical power by the fan circulating atmosphere through the fins.

Many heat transfer systems use an external source of energy to pump a recirculating heat transfer fluid. Most of these do not incorporate the pumped heat transfer fluid in an active spreader plate geometry that can be implemented as a replacement for a passive spreader plate. Most of these incur the cost disadvantage of requiring separate motors to impel the heat transfer fluid and to impel the atmosphere. Most of these incur the reliability disadvantage of using sealed shaft feed-throughs to deliver mechanical power to the heat transfer liquid. Most incur the added assembly cost and reliability exposure associated with hoses and fittings. None of these existing heat transfer systems simultaneously use a single motor to drive an impeller for the heat transfer fluid and an impeller for the atmosphere, use moving external magnetic fields to eliminate a rotary seal, and use monolithic assembly without hoses or fittings.

U.S. Pat. No. 1,819,528 describes a refrigerator. A motor sealed in the Freon reservoir compresses and circulates Freon through external plumbing coils, while simultaneously driving an atmosphere cooling fan using an eddy current based magnetic coupling. The internally generated moving magnetic fields cause the atmosphere moving fan to rotate more slowly that the Freon compressing impeller.

U.S. Pat. No. 4,519,447 describes an active spreader plate. The heat transfer fluid in the plate is impelled by magnetohydrodynamic pumping, which uses stationary magnetic fields plus large electric currents passing through the heat transfer fluid, as opposed to moving magnetic fields alone.

U.S. Pat. No. 5,183,104 describes a closed cycle expansion valve impingement cooling system for semiconductor chips. It utilizes hoses and fittings, and does not use moving external magnetic field to impel the heat transfer fluid.

U.S. Pat. No. 5,316,077 describes an active spreader plate. The heat transfer fluid in the active spreader plate is impelled by an impeller embedded in the active spreader plate that is driven by a sealed shaft passing through the plate.

U.S. Pat. No. 5,731,954 describes an electronics cooling system. The heat transfer fluid is impelled by an external pump, and the fluid circulates through discrete heat exchange elements through hoses and couplings.

SUMMARY OF THE INVENTION

The primary objective of this invention is to provide a low cost high reliability heat exchange apparatus that incorporates a composite substrate containing flow channels and a heat transfer fluid, providing low thermal resistance cooling to high density heat sources.

A further objective of this invention is to provide a design for cooling electronic components that is compatible with the geometry and manufacturing tooling associated with the passive spreader plate heat sinks currently in general use.

A further objective of this invention is to provide an active spreader plate with no moving or rotary mechanical seals.

A further objective of this invention is to provide a heat sink design for electronic components that uses a single motor to impel atmospheric motion and the motion of an additional heat transfer fluid.

A further objective of this invention is to provide an active spreader plate without hoses or fluid couplings.

DETAILED DESCRIPTION

Figure 1:
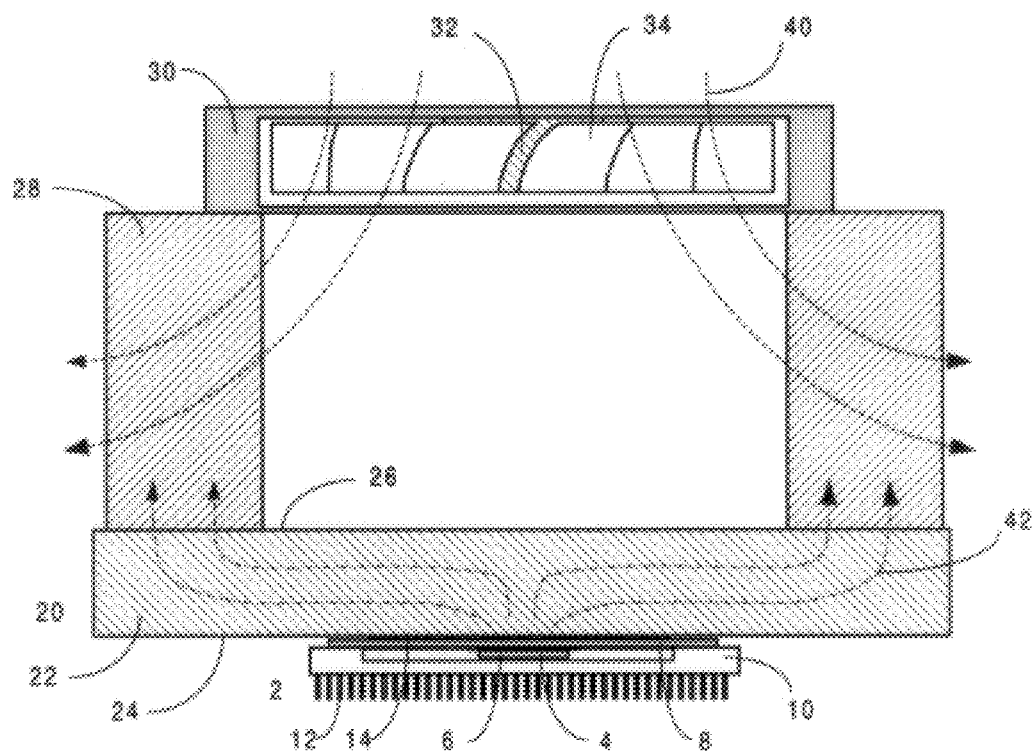
FIG. 1 shows an example from the prior art of a heat exchange device with a heat source, a spreader plate, a fin array, and an atmospheric mover.

The heat absorber used in this apparatus will typically facilitate transfer of heat to a surrounding fluid. For clarity, in the remainder of the specification we will refer to the surrounding fluid as atmosphere, however it can also be water, Freon, glycol, steam, or any other thermal transfer fluid. The heat absorber will typically therefore be a fin means to provide good thermal contact to the surrounding fluid. In a less preferred embodiment the heat absorber can contain a material undergoing a phase transition, so that the heat absorber by itself can be an isothermal sink for heat.

A simplified limiting case helps to identify applications that need an active spreader plate instead of a passive spreader plate. Suppose that a heat source with an area $A_s$ needs to be attached to a heat sink with a thermal resistance $R_\theta$. We idealize the problem by allowing the heat source to be a hemisphere, and by allowing the spreader plate to be a large hemispherical shell. This idealized three dimensional radial heat flow minimizes the temperature drop within the spreader plate. If we say that the spreader plate can contribute at most a thermal resistance of $R_\theta/2$, we can solve for the minimum allowable thermal conductivity of the spreader plate material:

$$k_{spreader} = \frac{2}{R_\theta \sqrt{A_s}}$$

For example, the Intel road map for microprocessor cooling for the year 2006 calls for 200 watts to be dissipated at a junction temperature of 95° C. into ambient atmosphere at 45° C. from a 15 mm×15 mm chip. From these specifications we have that $R_\theta$=0.25° C./watt and that $A_s$=2.25 square centimeters. The minimum spreader plate thermal conductivity is then calculated by the above equation to be 533 wattst(° C. meter). Since pure aluminum has a thermal conductivity of 202 watts/(° C. meter), pure copper has a thermal conductivity of 385 watts/(° C. meter), and even silver (the metal with the highest thermal conductivity) is 410 watts/(° C. meter), no metals are available as passive thermal spreaders for this application, even under ideal conditions.

We define a composite substrate to be a rigid assembly of at least two patterned objects that hermetically enclose one or more interior channels or passageways. The most preferred embodiment of the composite substrate is an ultrasonically welded assembly of several injection molded plastic shells. Another less preferred embodiment is for the composite substrate to be composed of several formed metal plates that are welded or soldered together. Another less preferred embodiment is for the composite substrate to be composed of several stamped plastic and metal plates that are bonded together with adhesives.

The most preferred application of a composite substrate for transferring heat from a heat generating object to a heat absorbing object is as an active thermal spreader plate for electronic heat sink applications. Other preferred applications include thermal processing heat exchangers, temperature control of isolated chambers, and thermal equalization of surfaces. For clarity and without a loss of generality, we will refer to the composite substrate as an active spreader plate in the remainder of the specification.

To illustrate the intent and implementation of the invention, FIG. 1 shows and example of a prior art heat transfer device. The heat source (2) comprises a semiconductor chip (4) cemented (6) to a metal cover (8). The cover (8) is hermetically sealed to a chip carrier (10), which acts as a carrier for the electrical contacts (12) between the chip and the next level of electronic packaging. A compliant thermal conductor and electrical insulator (14) conducts heat from the heat source (2) to a passive spreader plate (20). Heat enters the passive spreader plate on its lower surface (24) and is conducted through the bulk of the passive spreader plate (22) to the periphery of the top surface (26), where it is conducted out of the passive spreader plate into heat absorbing devices (28). The passive spreader plate is typically aluminum owing to aluminum's good thermal conductivty, low cost, and low weight. Other materials used for the spreader plate are steel, copper, pyrolytic graphite composite, and diamond, in order of increasing performance and increasing cost The heat flow lines (42) radiate from the heat source (2) through the passive spreader plate (20) to the heat absorber (28). The heat absorber (28) consists of a material permeable to fluid flow and capable of conducting heat away from the passive spreader plate (20); examples of various heat absorber designs will be subsequently described. A fan housing (30) supports a motor and rotor (32), and blades (34) are attached to the motor and rotor (32). Atmosphere is impelled to flow (40) through the fan and through the heat absorbing devices (28), so that heat is transferred to the air and exhausted into the environment. Other orientations of the atmosphere flow are operable, however this impinging flow is generally the most successful because by directing the flow towards the base of the heat absorber, the thermal efficiency of the heat absorber is typically increased.

Figure 2:
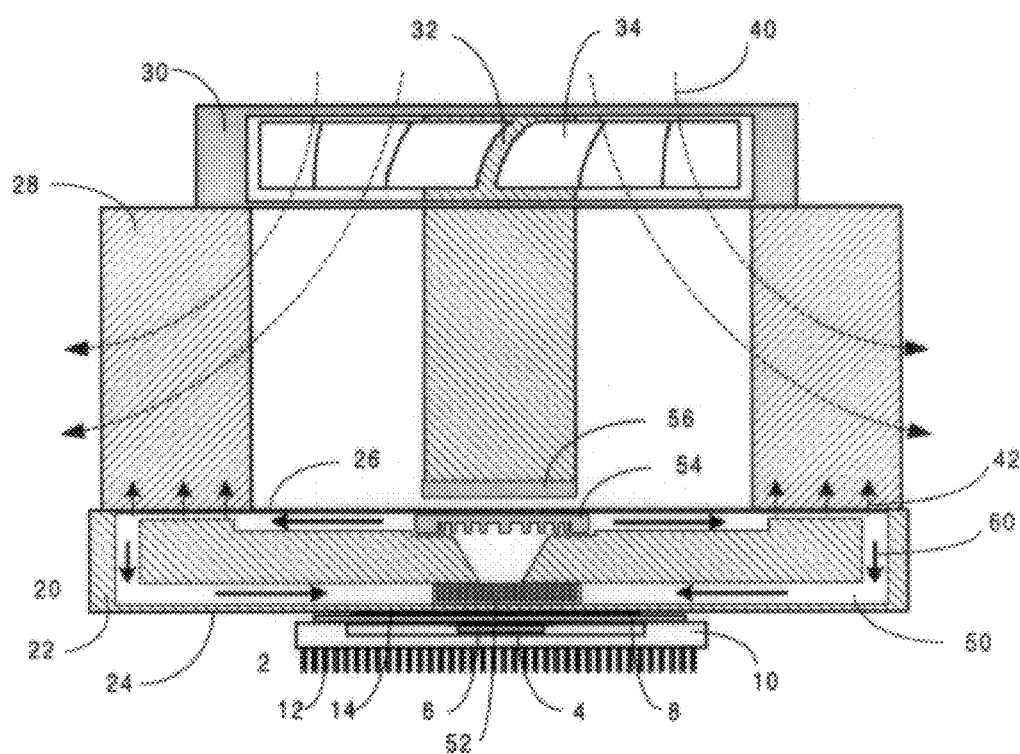
FIG. 2 shows a cross section of the current invention, including a composite substrate, an external impeller, an external motor, and an impeller internal to the composite substrate that is magnetically coupled to the external motor.

In FIG. 2 we show an embodiment of the invention as an evolution of the prior art design of FIG. 1. The heat source (2) comprises previously described elements. A compliant thermal conductor and electrical insulator (14) conducts heat from the heat source (2) to the active spreader plate (20).

Heat enters the active spreader plate (20) on its lower surface (24), and is conducted into a metallic fin array (52). Instead of the heat primarily being conducted by the solid bulk material of the active spreader plate (22), it is transfer from the fin array (52) into a heat transfer fluid sealed in flow channels (50) inside the active spreader plate (20). The heat transfer fluid is impelled to flow by a mechanism described later, so that the heat transfer fluid releases heat near the periphery of the top surface (26), where the heat is conducted out of the active spreader plate into heat absorbing devices (28). A fan housing (30) supports a motor and rotor (32), and blades (34) are attached to the motor and rotor (32). Atmosphere is impelled to flow (40) through the fan and through the heat absorbing devices (28), so that heat is transferred to the atmosphere and exhausted into the environment. The rotor (32) has an extended cylindrical support for a permanent magnet (56), so that the magnet is maintained a small distance above the surface (26) of the active spreader plate, and so that the magnet (56) is rotated with the fan blades (34). The configuration and composition of the magnet will be subsequently described. A rotatable impeller (54) inside the active spreader plate and immersed in the heat transfer fluid is motivated to rotate by the moving magnetic fields emanating from the magnet, which in turn impels the heat transfer fluid to circulate through the flow channels (50). In the most preferred embodiment the impeller (54) is a centripetal or centrifugal pump that impels the heat transfer fluid to circulate as indicated (60); the heat transfer fluid flows radially outwards from the impeller (54), then in proximity to the heat absorbing devices (28), then back towards the fin array (52), and finally up again to the impeller (54). The composition of the heat transfer fluid is preferably a low viscosity high heat capacity material such as mixtures of water with alcohols or ethylene glycol. In the absence of the internal fin array (52) a preferred embodiment uses a low melt metal alloy as the heat transfer fluid, such as the 58° C. eutectic containing gallium.

Figure 13:
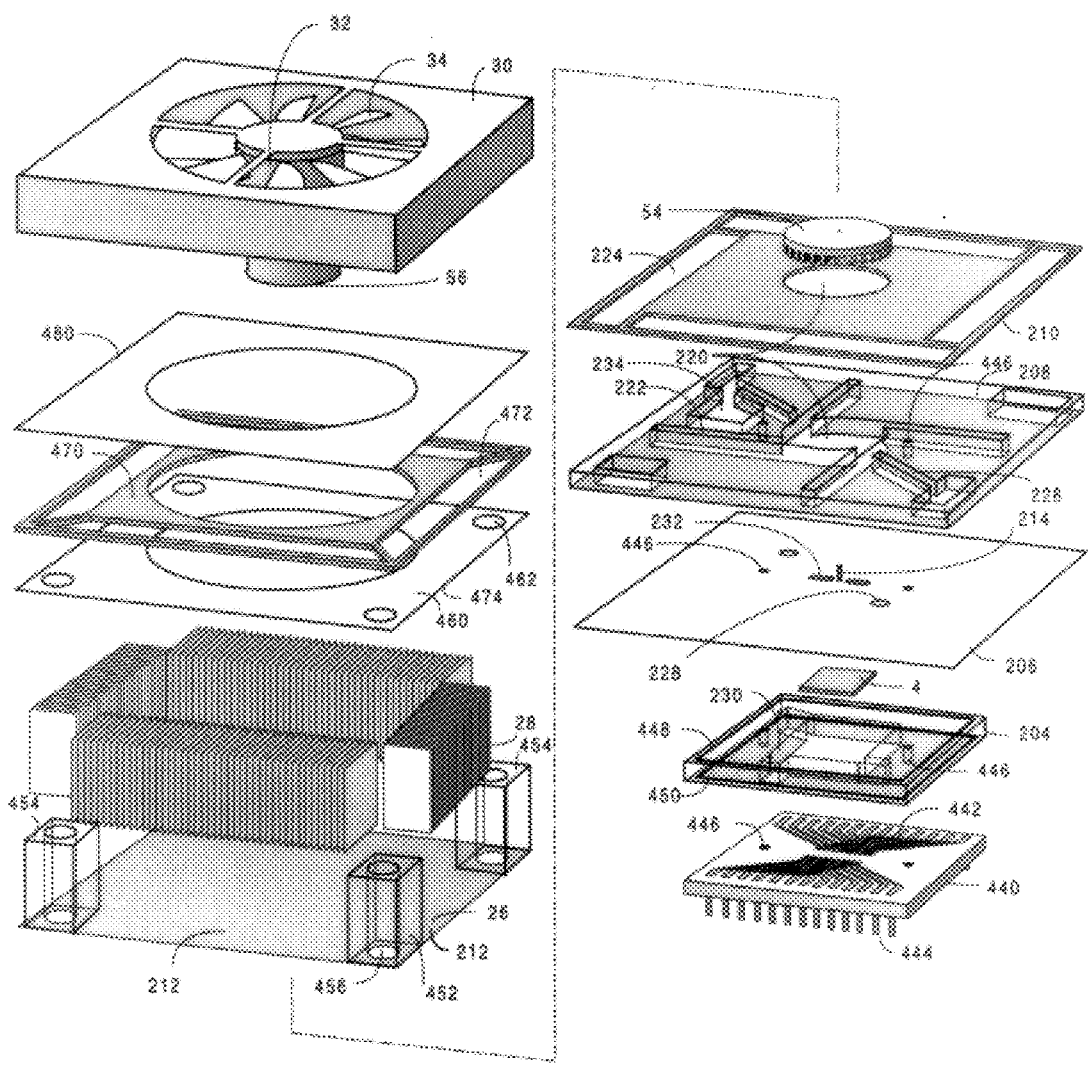
FIG. 13 shows a heat producing component mounted inside of the composite substrate.

The component parts of the active spreader plate will preferably be assembled initially without the heat transfer fluid filling the flow channels. There are several ways to fill the flow channels with heat transfer fluid and to subsequently seal the assembly that are well known to those skilled in the art. A preferred technique is to provide one or more access holes in the initial assembly which allow both the heat transfer fluid to be injected and the atmosphere inside the initial assembly to be remove; the access holes are then sealed with adhesive, plugs, or heat seals. An alternative preferred technique is to seal the initial assembly with one or more rubber septums; a hypodermic syringe can then inject the heat transfer fluid through the septum into the flow channels after initial assembly. In FIG. 13 we describe another less preferred embodiment, in which sub-assemblies of the active spreader plate are screwed together with elastomeric seals; in this case the final assembly can be done with the sub-assemblies immersed in the heat transfer fluid.

In FIG. 2 a tubaxial fan impels the atmosphere to flow in contact with the fin means. Other types of impellers known to those skilled in the art can also be used, such as blowers and laminar flow fans.

Figure 3:
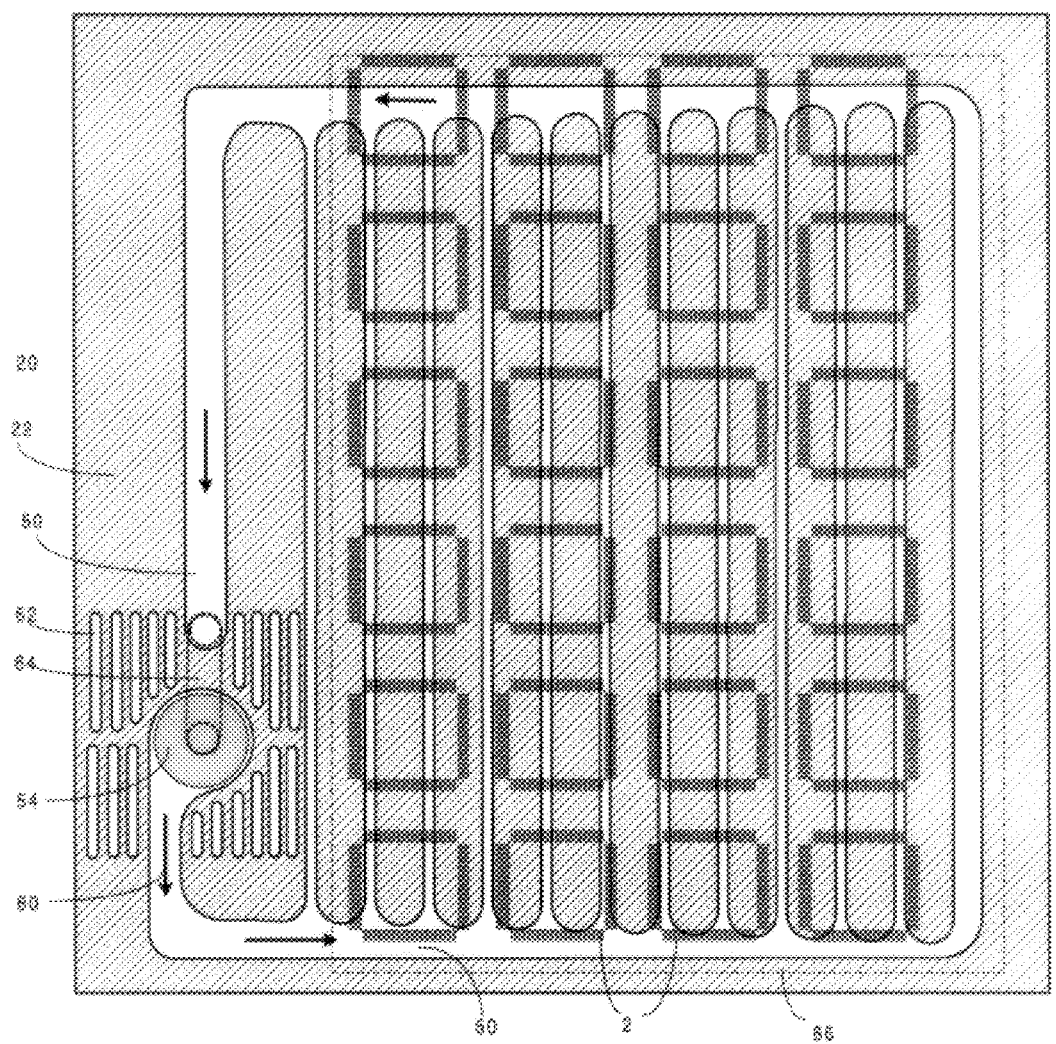
FIG. 3 shows coplanar first and second surfaces of the composite substrate.
Figure 3:
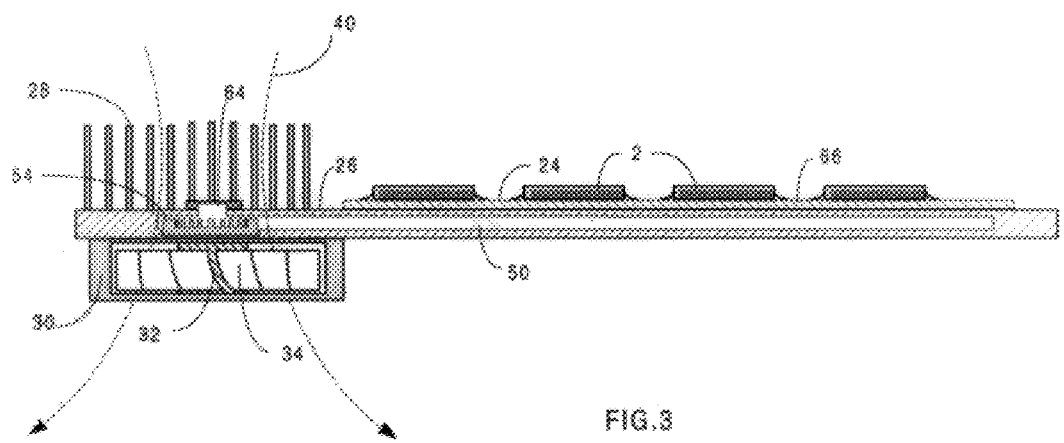

FIG. 3 shows an alternative preferred embodiment of an active spreader plate designed to transfer heat from one or more heat sources on one side of the active spreader plate to a heat absorbing device also on the same side of the active spreader plate. This embodiment of the active spreader plate is shown laminated to the back side of a printed circuit board on which there are several heat dissipating components. Several heat sources (2) generate heat, which is transferred through a printed circuit board (66) and through the surface (24) of the active spreader plate (20) into a heat transfer fluid sealed in flow channels (50) and (64). The circuit board can contain thermal vias to improve the thermal conductivity of the circuit board (66). A fan housing (30) supports a motor and rotor (32), and blades (34) are attached to the motor and rotor (32). Atmosphere is impelled to flow (40) through the fan, through slots (62) in the active spreader plate (20), and through the heat absorbing devices (28), so that heat is transferred to the atmosphere and exhausted into the environment. The rotor (32) contains a magnet proximal to the active spreader plate. A rotatable impeller (54) inside of the active spreader plate and immersed in the heat transfer fluid is motivated to rotate by the moving magnetic fields emanating from the magnet, which in turn impels the heat transfer fluid to circulate through the flow channels (50). A bypass flow channel (64) conducts heat transfer fluid to the center of the impeller (54).

Figure 4:
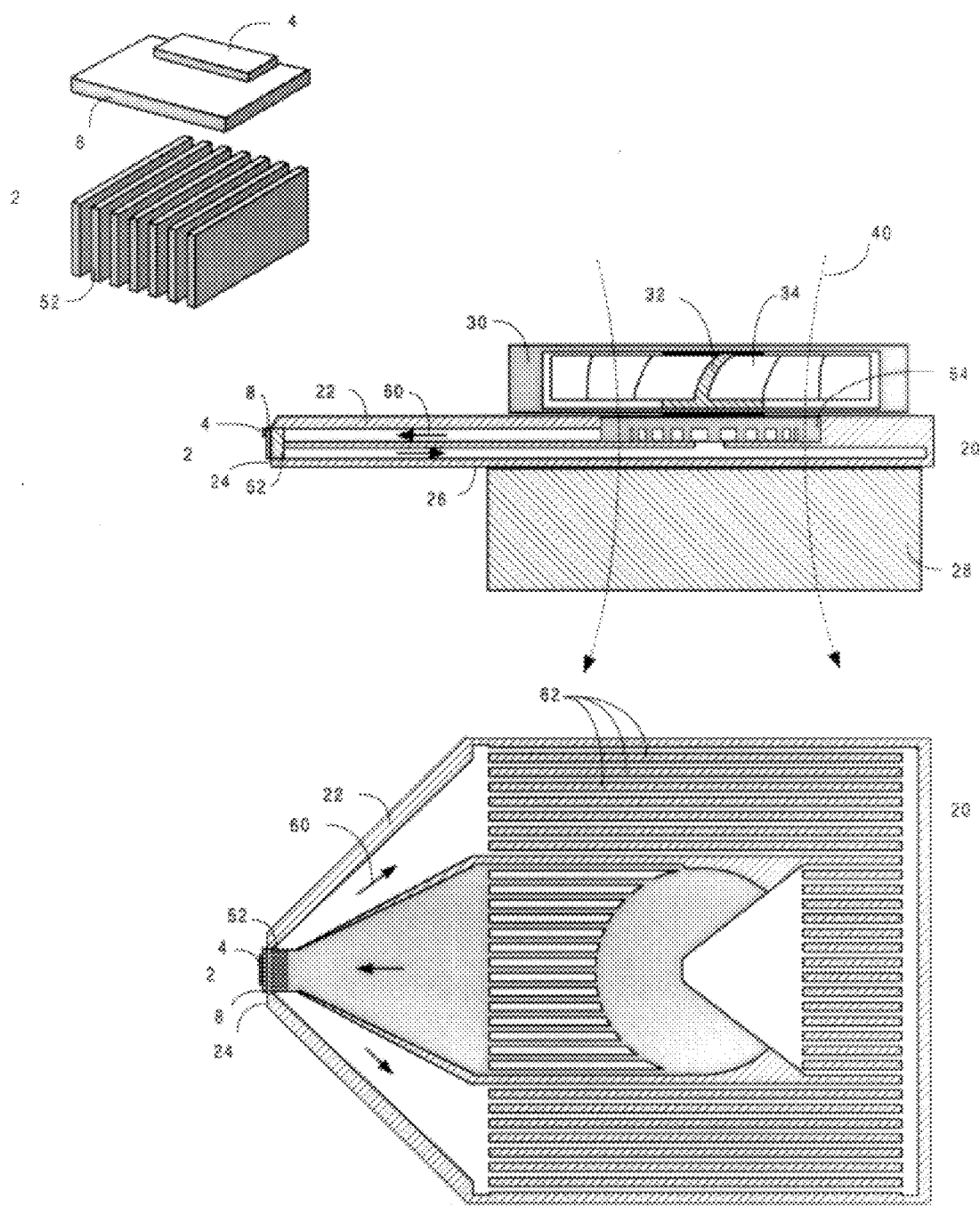
FIG. 4 shows a composite substrate where the normals to the heat transfer surfaces are perpendicular, where the composite substrate is cooling a laser bar array.

FIG. 4 shows an alternative preferred embodiment of an active spreader plated designed to transfer heat from a heat source on a first surface of the active spreader plate to a heat absorbing device on a second surface of the active spreader plate, where the normals to the first and second surfaces are perpendicular to each other. This embodiment of the active surface plate is optimized for cooling a solid state laser bar. The heat source (2) is a semiconductor (4), which is thermally attached to a small passive spreader plate (8). The small spreader plate (8) thermally contacts a small fin array (52). The elements of the active spreader plate, fan, and fin means have been previously described. Solid state laser array bars are one of the most demanding electronics cooling applications. A typical device might contact a heat sink over an area 0.6 mm×10 mm, and dissipate 40 watts of waste heat at a junction temperature of 55° C. The aerial thermal resistance of this combination is 0.015° C. $cm^2$ per watt (assuming that the heat sink requires a 10° C. temperature gradient to operate), which is about 20 times smaller (more difficult) than what microprocessors will require over the next decade. Typically high power continuous duty laser bars are cooled today with refrigerated water. The design shown in FIG. 3 has sufficiently low thermal resistivity that only the temperature drop between the junction and ambient (assumed to be 35° C.) is required. In this application the heat transfer fluids of choice are liquid metals, such as alloys of bismuth, tin, lead, cadmium, indium, mercury, gallium, sodium, and potassium. These alloys have low viscosity and high thermal conductivity compared to alternative heat transfer fluids. The most preferred embodiment of a laser bar cooler uses an alloy of sodium and potassium, chosen so that the melting point stays below the coldest expected ambient temperature.

Figure 5:
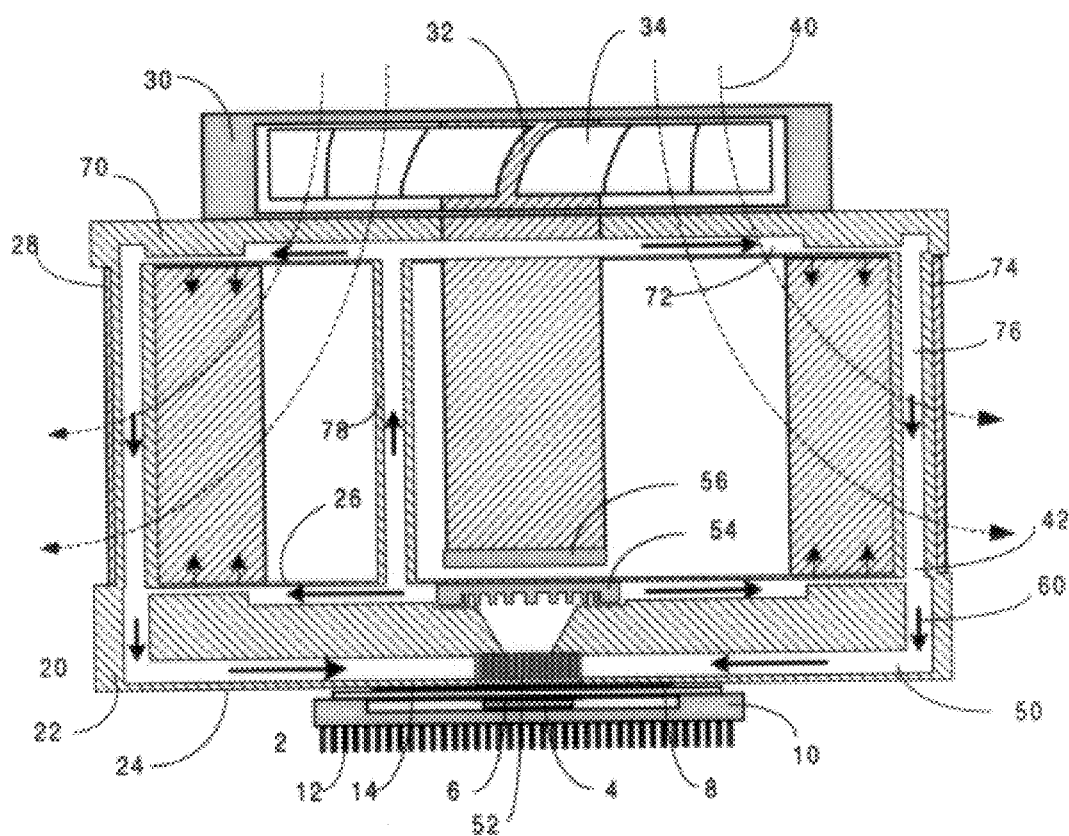
FIG. 5 shows two composite substrates attached to a common fin array.

FIG. 5 shows a preferred embodiment of an active spreader plated, in which the active spreader plate of FIG. 2 has been augmented with a second active spreader plate (70) attached to the heat absorbing devices (28), so that the first and second heat active spreader plates are each attached to different surfaces of the heat absorbing device (28). Multiple conduits (74 and 78) are hermetically sealed to the first and second active spreader plates, flowably connecting the flow channels (50) and (72) with passageways (76). In this alternative preferred embodiment, the second active spreader plate and the fan frame (30) form a single fabricated component. The heat absorbing devices (28) are preferably fin means. The principle advantage of the design shown in FIG. 5 is that the temperature gradient within the fin means is reduced, due to the shorter path length for heat conduction that results from heating the fin means from two surfaces. This advantage could, for example, allow the use of lighter and less expensive fin means.

Figure 6:
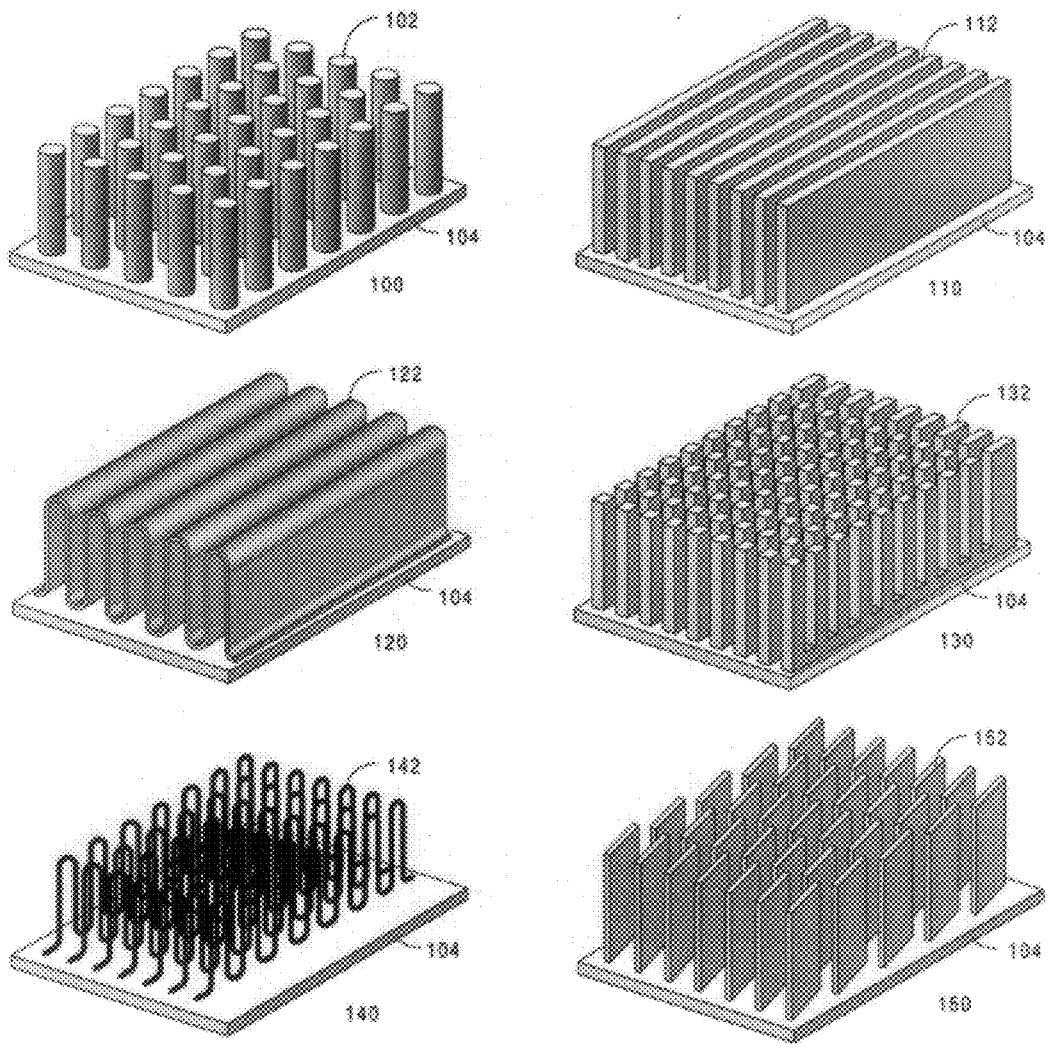
FIG. 6 shows various fin means.

FIG. 6 shows several embodiments of fin means, all of which are know in the prior art Each of the fin means is characterized by a thermal conduction means such as pins (102), fins (112), foil (122), stampings (132), wires (142), louvers (152), plates, or sheets. The thermal conduction means are arrayed so as to be permeable to a flowing heat transfer fluid such as the atmosphere, while also thermally contacting one or more surfaces (104). The fin means function to increase the effective area of contact between a heat transfer fluid such as the atmosphere and one or more surfaces (104). Fin means can be manufactured by forging, folding, gluing, welding, brazing, casting, molding, coining, or other processes. Fin means are preferably composed of aluminum, and can also be formed using metals such as copper, aluminum, iron, zinc, nickel, and silver, as well as composite materials including graphite filled plastics. The surfaces of the thermal conduction means can be grooved, textured, dimpled, embossed, or drilled to increase their surface area in contact with the heat transfer fluid.

Figure 7:
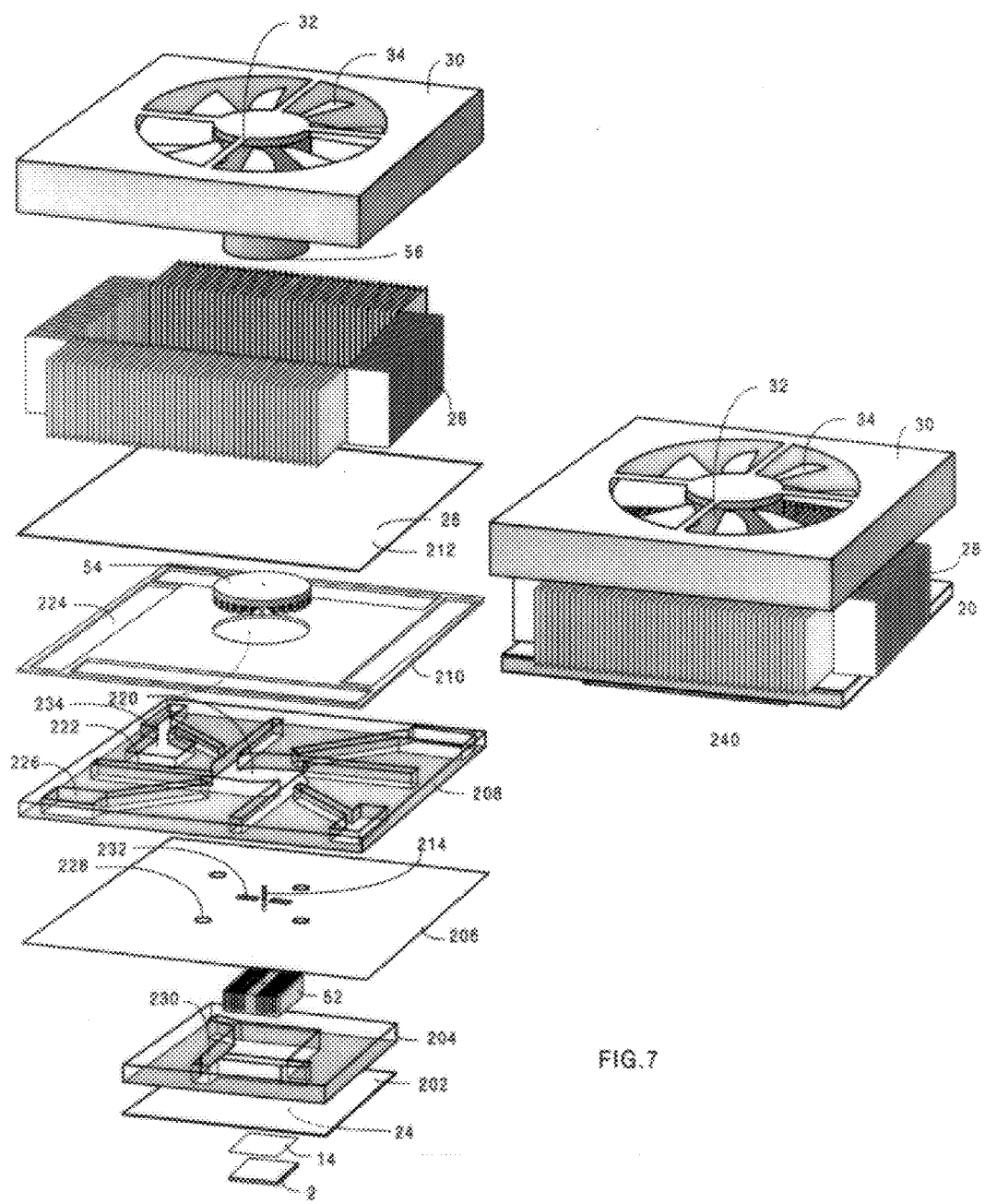
FIG. 7 shows the construction of a composite substrate with a plurality of interior channels, the heat producing component attached to the outside of the composite substrate, the heat producing component thermally contacting a fin means in the interior of the composite substrate.

FIG. 7 shows an assembly of a heat sink containing an active spreader plate. A heat source (2) is attached to the bottom sheet (202) of the active spreader plate assembly through a compliant insulating layer (14). If the heat source is a semiconductor device which is sensitive to magnetic fields, the bottom sheet (202) should be composed of a ferromagnetic material that will shield the heat source from magnetic field sources in the active spreader plate. Heat from the heat source passes through the bottom surface (24) of the bottom sheet (202) and into a fin means (52) attached to the top surface of the bottom sheet (202). The fin means (52) is contained in a pocket (230) bounded by a lower stamped plate (204), the bottom sheet (202), and a medial sheet (206). Heat transfer fluid enters the pocket (230) through four holes (228), passes in contact with the fin means (52), and exits through slots (232). An upper stamped plate (208) is attached to the top of the medial sheet (206). A channel forming sheet (210) is attached to the top of the upper stamped plate (208), and a top sheet (212) seals the top of the channel forming sheet (210). The top sheet (212) is easily penetrated by externally generated magnetic fields; the top sheet (212) can be a poor electrical conductor and a non-ferromagnetic material, or it be so thin that its effect on the magnetic fields is negligible. A rotatable impeller (54) is trapped in coaxial cavities (220) in the channel forming sheet (210) and the upper stamped plate (204). The rotatable impeller (54) is shown mounted on an axle (214) which is seated in the fin means (52) and which protrudes through the medial sheet (206). The bottom sheet (202) and fin means (52) are preferably metallic. The lower stamped plate (204), the medial sheet (206), the upper stamped plate (204), the channel forming sheet (210), and the top sheet (212) are preferably formed from plastic. Fin means (28) attaches to the upper surface (26) of the top sheet (212). A fan housing (30), rotor (32), and fan blades (34) are attached to the top of the fin means, rotatably suspending a permanent magnet (56) adjacent to the impeller (54). Rotation of a permanent magnet (56) motivates the impeller to rotate, thereby impelling the heat transfer fluid sealed inside the active spreader plate rising through slots (232) to flow radially away from the impeller (54) through channels (222) in the upper stamped plate (204), then to flow in the plane of the channel forming sheet (210) and in thermal communication with the fin means (28), to then flow radially towards the impeller through channels (226), where the fluid enters the lower pocket through four holes (228). A gas filled bladder (not shown) resides in a cavity (234) in the upper stamped plate (208); the bladder and its function will be described later. The entire heat sink assembly is shown in (240). The components of the active spreader plate shown in FIG. 7 are designed to be stamped from sheets and subsequently assembled with adhesives, ultrasonic bonding, solvent bonding, or welding. Those skilled in the art will recognize that the individual components of the active spreader plate could be molded, and that several of the described components can be functionally combined if the components are molded.

Figure 8:
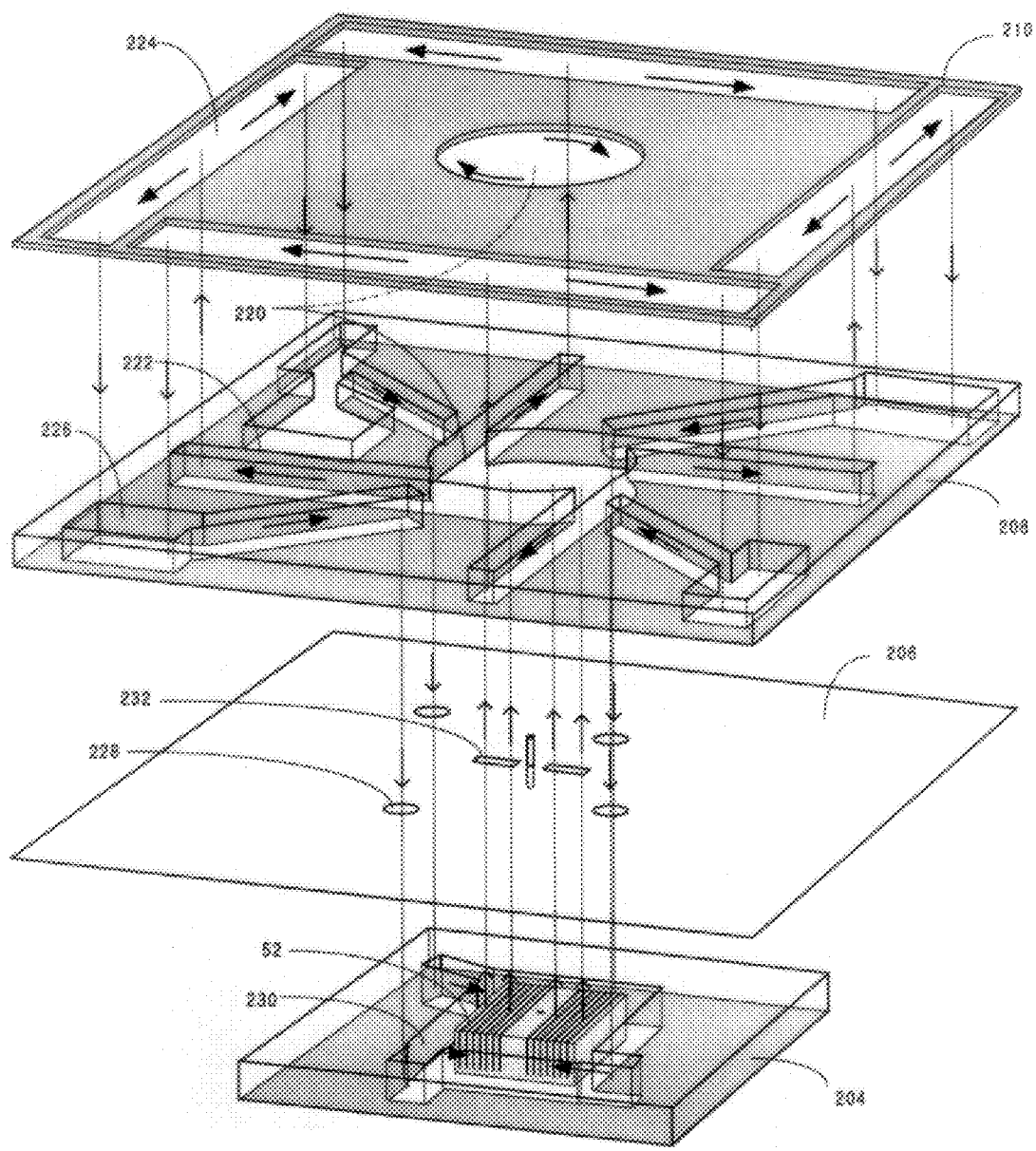
FIG. 8 shows the thermal fluid flow pattern in the composite substrate of FIG. 7.

FIG. 8 shows a detailed heat transfer fluid flow pattern for the heat sink assembly described in FIG. 7.

Figure 9:
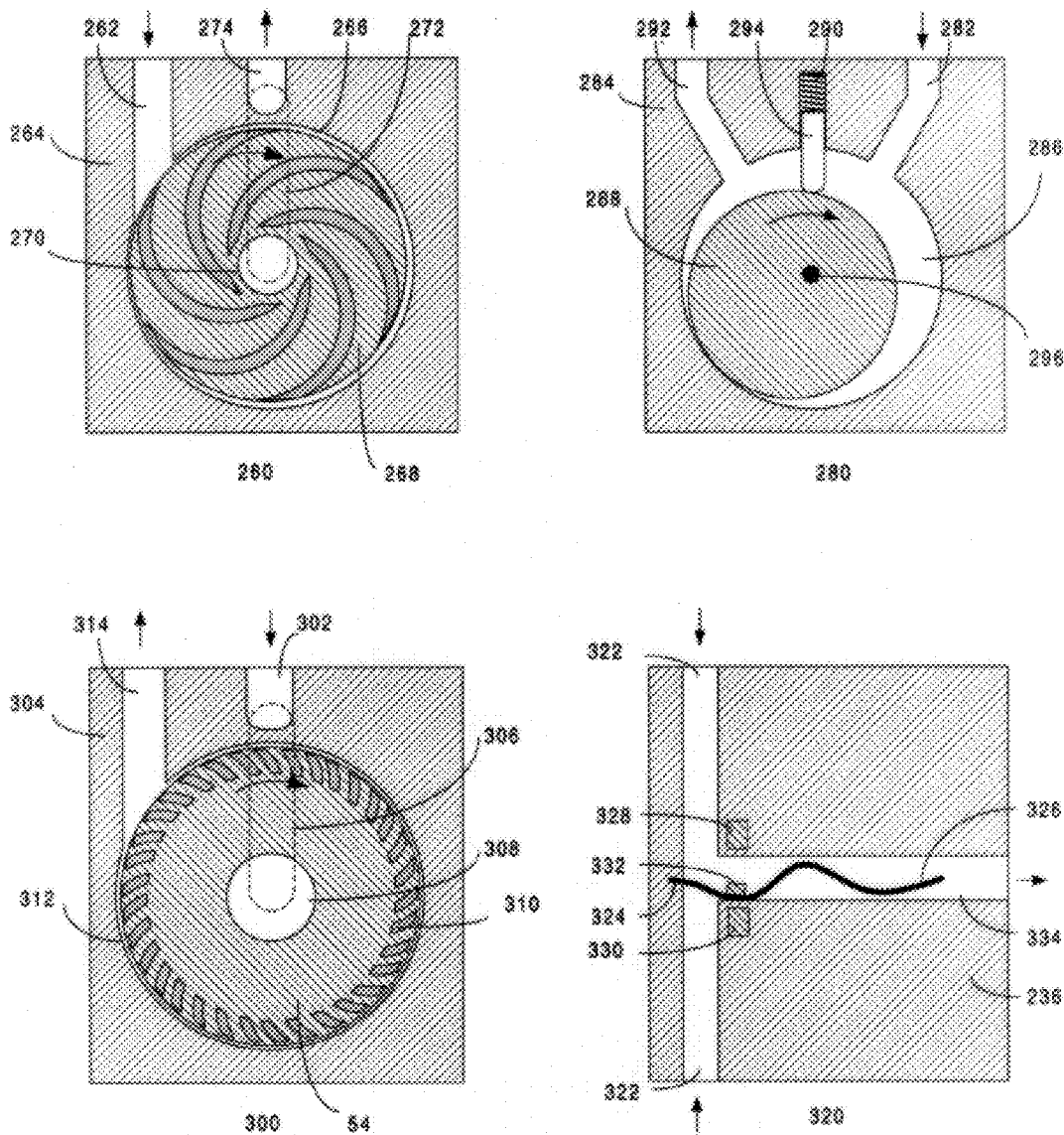
FIG. 9 shows various impeller designs, including a centrifugal pump, a displacement pump, a viscosity pump, and a flexure pump.

FIG. 9 shows several examples of fluid impellers that can effectively be used in an active spreader plate. Each is motivated by moving external magnetic fields. In the upper left is a viscosity pump (260). A heat transfer fluid feeds the viscosity pump (260) through a channel (262) leading to a circular cavity (266) in the composite substrate material (264). A rotor (268) formed with lands and grooves and a central opening (270) rotates as shown in the cavity (266) due to the action of external magnetic fields. Viscous drag of the heat transfer fluid between the rotor (268) and the cavity (266) drives the heat transfer fluid towards the center of the rotor (268). The heat transfer fluid leaves the pump (260) by passing through a channel (272) under the rotor (268) which joins with the exit channel (274). In the upper right is a displacement pump (280). A heat transfer fluid feeds the displacement pump (280) through a channel (282) leading to a circular cavity (286) in the composite substrate material (284). An eccentric disk shaped rotor (288) in the cavity (266) rotates on a axle (296) due to the action of external magnetic fields. A movable plunger (294) presses against the rotor (288) driven by a spring (290). The rotation shown of the rotor (288) draws fluid into the cavity (286) and then impels the heat transfer fluid out through a channel (292). In the lower left is a centripetal or centrifugal pump (300). A heat transfer fluid feeds the centripetal pump (300) through a channel (302) which leads to a bypass channel (306) and then to the center (308) of a circular cavity (312) in the composite substrate material (304). A rotor (54) formed with a blower-like perimeter of fins (310) and a central opening rotates as shown in the cavity (312) due to the action of external magnetic fields. Momentum transferred from the rotor (54) to the heat transfer fluid accelerates the fluid, which exits the centripetal pump (300) through the exit channel (314). In the lower right is an oscillatory pump (320). A heat transfer fluid feeds the oscillatory pump (320) through one or more channels (322) in the composite substrate material (336). A flexure composed of material such as stainless steel or nichrome shim stock is mounted so that at is partially fixed (324) to the composite substrate (336) and partially freely suspended (326) in a channel (334). Ferromagnetic pole faces (328 and 330) on either side of the channel (334) conduct externally generated magnetic fields so that they interact with a permanent magnet (332) attached to the freely suspended portion of the flexure (326). If, for example, the permanent magnet (332) is poled in FIG. 9 so that N is up and S is down, then if both pole faces (228 and 230) are magnetized N due to an externally generated field, then the permanent magnet (332) will be pulled down; and similarly if both pole faces (228 and 230) are magnetized S due to an externally generated field, then the permanent magnet (332) will be pulled up. The traveling sinusoidal wave that develops on the flexure (326) impels the heat transfer fluid to exit the oscillatory pump (320) through the exit channel (334).

Other impeller mechanisms are known to those skilled in the art These include a featureless rotating disk (a Von Karman pump), a rotating disk connected with cranks to a reciprocating cylinder with valves, and an oscillating diaphragm pump with entrance and exit valves.

Magnetohydrodynamic drive for the fluid is not a preferred embodiment. In a magnetohydrodynamic drive (MHD) a stationary magnetic field passes through a flow channel perpendicular to the flow direction of the channel, and an electric current is passed through the heat transfer fluid in the flow channel so that the current is perpendicular to both the flow direction and the magnetic field. In large MHD pumps, such as those used in nuclear reactor cooling, several horsepower of electrical power is dissipated in the large voltages and electric currents passed through the heat transfer fluid. When an MHD is scaled down to operate in an active heat sink only several inches across, the drive voltage scales down but the electric remain large for a constant required pressure and available magnetic field strength. Power supplies to produce hundreds of amps are expensive and worth avoiding in low cost designs.

Figure 10:
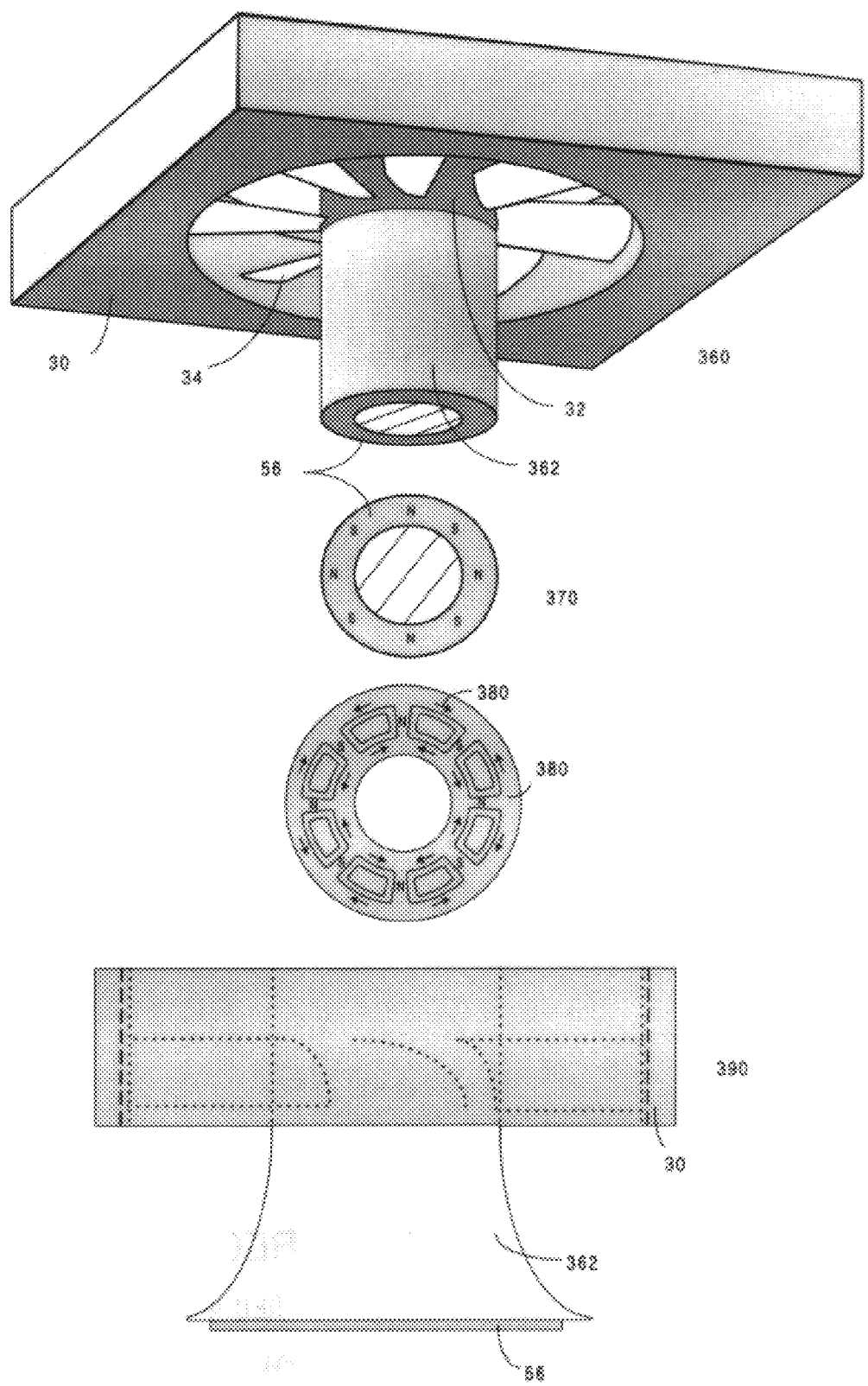
FIG. 10 shows eddy current and permanent magnet designs for magnetically coupling an impeller interior to the active spreader to plate to a motor exterior to the active spreader plate.

FIG. 10 shows the preferred configuration for generating the moving magnetic field external to the active spreader plate. A fan housing (30) supports a rotor (32), onto which are attached fan blades (34) and a rotor extension (362). A ring ceramic permanent magnet (56) is attached to the end of the rotor extension (362). The ring ceramic magnetic (56) could alternatively be replaced with a series of smaller magnets. Ceramic magnets are the preferred embodiment because of their low cost; if Alnico or rare earth magnets become more cost effective they would be preferable to ceramic magnets. The ring ceramic magnet (56) is preferably poled to create a series of alternating north and south pole faces around the circumference of the ring as shown (370). When a permanent magnet poled as in (370) is rotated above a washer of electrically conductive material (380), eddy currents are induced as shown (382). The magnetic fields generated by the eddy currents (382) create a torque on the washer (380) in the direction of rotation of the permanent magnet (370). In (390) we show an alternative preferred embodiment in which the rotor extension (362) flares out as it approaches the end to which the permanent magnet (56) is attached. The flared configuration shown in (390) is advantageous since more torque is imparted to the washer of electrically conductive material (380) for the same magnetic field strength, and since air from the fan is smoothly deflected from its axial direction through the fan to the radial motion through the fin means.

Eddy current coupling requires that large currents (hundreds of amps) are generated in the impeller to interact with the external moving magnetic field. While such currents are a challenge in small scale MHD designs, they are not a problem for eddy current driven impellers, since the external moving magnetic fields generate the currents naturally, and the eddy currents are contained within the impeller.

If the heat transfer fluid is a good electrical conductor, the moving magnetic fields can generate eddy currents in the heat transfer fluid directly. If this is done, the drag on the fluid by the moving external magnetic field imparts vorticity to the flow so that the fluid becomes its own centripetal pump. This less preferred embodiment is practical for high conductivity alloys such as NaK. However, generally better coupling between the magnetic fields and the fluid motion is achieved with a high electrical conductivity material, such as an impeller containing a copper washer. As we will show later, the power imparted to the fluid is proportional to the square of the electrical conductivity of the material in which the eddy currents are being generated, and copper is about 10 times higher in electrical conductivity that the most conductive low melt alloys. Copper is also cheaper per volume than most of the easily handled alloys such as those containing bismuth, indium, and tin, so that substituting a copper impeller for some alloy in the flow channel reduces the cost of the assembly. Incorporating an impeller increases the design flexibility because the fluid drive characteristics of the impeller (for example the perimeter velocity and the length of the vanes on the perimeter of a centripetal pump) can be made independent of the diameter of the rotor generating the moving external magnetic fields. The most preferred embodiment therefore uses an eddy current driven impeller immersed in the heat transfer fluid.

Most magnetically isolated pumps use permanent magnets on the driver and the impeller; the attraction of these magnets locks the isolated impeller to turn at the same rotation rate as the driver. The configuration with permanent magnets in the impeller is preferable in industrial processes where the pumping power expended is large; the heat dissipated by an eddy current drive could easily be high enough to melt down the impeller. However in typical active spreader plates the pumping power expended is small (on the order of a watt), so that the heat dissipated by the eddy current is not so significant A disadvantage of using permanent magnet coupling (at least for rotary pumps) is that mechanical bearings have to support the two assemblies of permanent magnets so that they stay separated. Mechanical bearings failure is the most common source of fan failure in heat sink applications, and the cost of the bearings are a substantial fraction of the cost of the fans. If permanent magnets are incorporated in the impeller, the fan bearings will have to support much greater axial loads than they are currently, so that the cost of the fan bearings will have to increase. Increasing the torque of the fan motor to compensate for the lower transfer efficiency of eddy current coupling is less expensive than increasing the mechanical strength of the rotor to support permanent magnet coupling. A thrust bearing will also be required for the impeller in the active spreader plate if permanent magnets are incorporated in that impeller. Therefore an active spreader plate incorporating permanent magnets embedded in the impeller is a less preferred embodiment.

In all preferred embodiments the heat transfer fluid is at least as dense as the surrounding atmosphere. It is therefore acceptable for the rotor operating the fan to rotate at the same rate as the impeller in the active spreader plate, as is the case for permanent magnet coupling, and it is desirable for the rotor operating the fan to rotate faster than the impeller in the active spreader plate, as is the case for eddy current coupling, however it is not desirable for the rotor operating the fan to rotate more slowly than the impeller in the active spreader plate.

Figure 11:
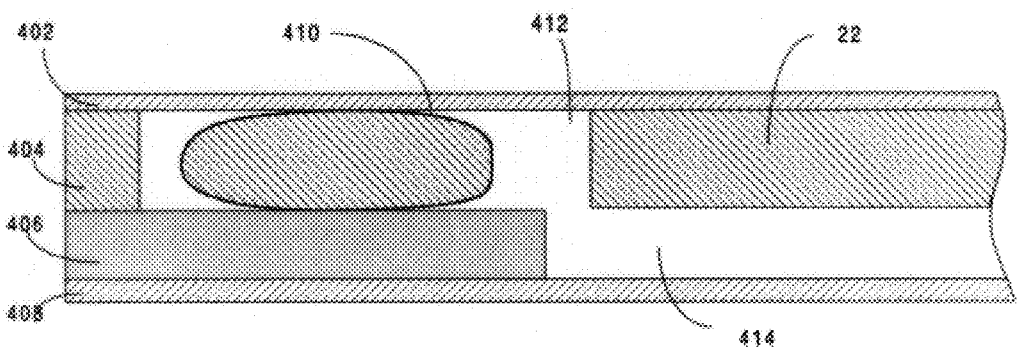
FIG. 11 shows a gas filled bladder in the interior of the composite substrate.

FIG. 11 shows a detailed cross section of an active spreader plate with a gas balloon or bladder. A pocket (412) in the composite plate (22) (similar to the pocket (234) in FIG. 7) is in fluid communication with the flow channels (414). Heat transfer fluid can thermally expand at different rates that the component parts (402, 404, 406, and 408) of the composite plate. Without a pressure relief means, temperature changes can generate potentially destructive pressures in the assembled active spreader plate. One pressure relief means is a gas filled balloon or bladder (410) that can change its volume in response to a temperature change to minimize the pressure changes in the assembly.

Figure 12:
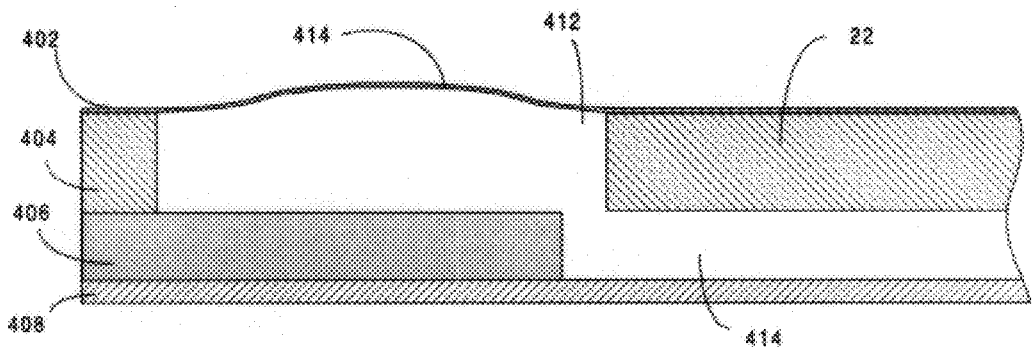
FIG. 12 shows a deformable surface element of the composite substrate.

FIG. 12 shows a flexible surface element on an active spreader plate, accomplishing the same function as the gas bladder described in FIG. 11. In this embodiment the exterior cover (402) of the active spreader plate is thin enough to act as a flexure, so that a volume difference between the heat transfer fluid and the nominal capacity of the active spreader plate is compensated by motion of the flexible portion of the cover (402). Such a volume difference might occur when the temperature of the active spreader plate is changed.

FIG. 13 show an assembly of a heat sink containing an active spreader plate. A semiconductor chip (4) is attached to an electrical interface module (440). For example a ball grid array on the chip can be soldered to electrical wiring (442) on the top of the interface module. The electrical wiring (442) connects the chip (4) to a pin grid (444) on the bottom of the module (440). The chip (4) is contained in a pocket (230) bounded by the module (440), a lower stamped plate (204), and the medial sheet (206). An o-ring (448) seals the interface between the stamped plate (204) and the medial sheet (206), and another o-ring (450) seals the interface between the stamped plate (204) and the module (440). Screws pass through screw holes (446) to attach the sub-assembly consisting of the chip (4) and module (440) to the remainder of the active spreader plate. Heat transfer fluid enters the pocket (230) through two holes (228), passes in intimate contact with semiconductor chip (4), and exits through slots (232). An upper stamped plate (208) is attached to the top of the medial sheet (206). A channel forming sheet (210) is attached to the top of the upper stamped plate (208), and a top sheet (212) seals the top of the channel forming sheet (210) except for four holes (456). A rotatable impeller (54) is trapped in coaxial cavities (220) in the channel forming sheet (210) and the upper stamped plate (208). The rotatable impeller (54) is shown mounted on an axle (214) which is seated in the medial sheet (206). Fin means (28) attaches to the upper surface (26) of the top sheet (212). A second spreader plate composed of a bottom sheet (474), a channel forming sheet (470), and a top sheet (480) is attached to the top portion of the fin means (28). Four fluid conduits (452 and 454) are hermetically sealed to the two active channel plates on the upper surface of the top sheet (212) and the lower surface of the bottom sheet (474). A fan housing (30), rotor (32), and fan blades (34) are attached to the top of the upper active spreader plate, rotatably suspending a permanent magnet (56) adjacent to the impeller (54). Rotation of permanent magnet (56) motivates the impeller (54) to rotate, thereby impelling the heat transfer fluid sealed inside the active spreader plate and rising through slots (232) to flow radially away from the impeller (54) through channels (222) in the upper stamped plate (208), then to flow in the plane of the channel forming sheet (210) and in thermal communication with the fin means (28), to then flow radially towards the impeller through channels (226), where the fluid enters the lower pocket through two holes (228). The fluid also follows a parallel path towards the second active spreader plate through conduits (454), through the channels (472) in the channel forming sheet (470), and returning to the first spreader plate through conduits (452). A gas filled bladder (not shown) resides in a cavity (234) in the upper stamped plate The components of the active spreader plate shown in FIG. 13 are designed to be stamped from sheets and subsequently assembled with adhesives, ultrasonic bonding, solvent bonding, or welding. The heat transfer fluid used in this embodiment is restricted to fluids which can come in direct contact with semiconductor chips, including mineral oil, Fluorinert (manufactured by the 3M Company), helium, and nitrogen.

If a heat transfer fluid such as a bismuth alloy is used which is liquid at all operating temperatures of the active spreader plate, but which can solidify when the active spreader plate is stored or shipped, then the situation arises when the system is starting up with solidified heat transfer fluid. In this situation heat source might overheat before the heat transfer fluid thaws and begins to flow and cool the heat source. When such solidifiable heat transfer fluids are used, a pre-heater may be required to thaw the fluid before the heat source begins to produce heat. An example such a pre-heater is a nichrome wire embedded in the active spreader plate material adjacent to the flow channels.

Figure 14:
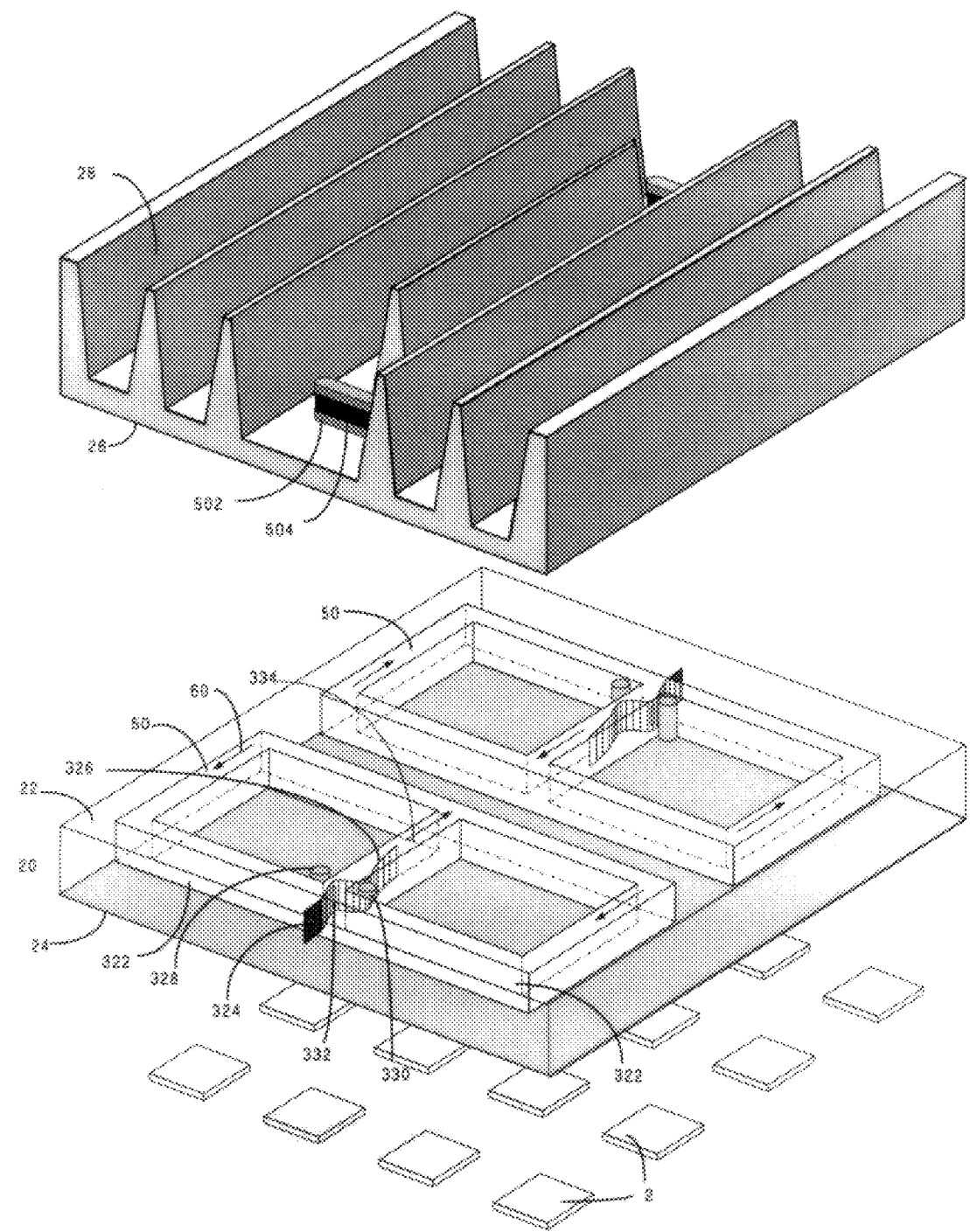
FIG. 14 shows a composite substrate containing two flexure impellers.

FIG. 14. shows an active spreader plate utilizing oscillating pumps to impel the heat transfer fluid. Several heat sources (2) are mounted on the lower surface (24) of an active spreader plate (22). The active spreader plate (22) contains several flow channels (50) for re-circulating heat transfer fluid through the active spreader plate (22). The upper surface (26) of the active spreader plate (22) contacts a passive fin array (28). Flexures are mounted to the spreader plate (324) allowing a portion of each flexure (326) to be freely suspended in a flow channel (334). Associated with each flexure is an electromagnet (504) wound on a bobbin (502) that magnetically connects with ferromagnetic pole faces (328 and 330) on either side of the channel (324). As described earlier, an electric current through the bobbin (502) of one polarity would pull the permanent magnet (332) attached to the flexure (326) towards one pole face (328), and reversing the polarity of the current through the bobbin (502) would pull the permanent magnet (332) attached to the flexure (326) towards the other pole face (330). The action of the flexures to circulate heat transfer fluid equalizes the temperature across the active spreader plate. If heat is being released from the heat sources, that heat is conducted to the fins (28) which transfer that heat to the atmosphere by natural convection. The action of the flexure (326) combined with the heat released from the heat sources impels the motion of the atmosphere associated with natural convection. In this case the use of a permanent magnet (332) to couple to the externally generated magnetic field does not require supporting bearings. The thickness of the flexure material (326) is chosen to reduce the strain rates in the flexure as it oscillates consistent with the required life of the flexure. A sensor such as a Hall effect sensor may be used in combination with the permanent magnet (332) to determine when to alternate the polarity of the drive current to the electromagnet (504).

We illustrate the operation of an eddy current driven impeller with the following relationships. If an eddy current driven impeller is rotating with a frequency $\omega_{impeller}$ and the magnet attached to the fan is rotating with a frequency $\omega_{fan}$, the electrical power dissipated as ohmic heating of the impeller will be $$P_{ohmic}=k_1\sigma_{impeller}^2(\omega_{fan}-\omega_{impeller})^2$$

where $k_1$ is a constant and $\sigma_{impeller}$ is the electrical conductivity of the impeller material.

The power dissipated in the fluid by the rotation of the impeller will have the form $$P_{fluid}=k_2\omega_{impeller}+k_3\omega_{impeller}^2$$

where $k_2$ and $k_3$ are constants related to the viscosity, inertia, and work performed by the fluid. The minimum power condition occurs for non-zero impeller velocity $$\omega_{impeller} = \frac{k_1 \sigma_{impeller}^2 \omega_{fan} - k_2/2}{k_1 \sigma_{impeller}^2 + k_3}$$

The impeller speed is always less than the fan speed, and the impeller speed is increased with an increase in the impeller's electrical conductivity. The coupling between the external magnetic field and the impeller ($k_1$) can be mechanically modified by adjusting the gap between the impeller and the rotating permanent magnet (56).

A presently preferred embodiment of the present invention and many of its improvements have been described with a degree of particularity. It should be understood that this description has been made by way of preferred example, and that the invention is defined by the scope of the following claims.

The invention claimed is:

1. An apparatus for transferring heat from a heat producing component to a heat absorbing component, comprising:
   a first composite substrate containing a closed interior channel for circulating a first thermal transfer fluid which may be completely contained within the closed interior channel; and
   a first electrically conductive rotatable fluid impeller contained in the closed interior channel, the impeller being motivated to rotate by eddy currents generated therein by an externally generated moving magnetic field, the rotation of the impeller motivating the first thermal transfer fluid to circulate, whereby the heat producing component transfers heat to the first thermal transfer fluid, and the first thermal transfer fluid transfers heat to the heat absorbing component.

2. The apparatus as in claim 1, wherein the first composite substrate has a first and a second surface, the first surface for thermally contacting the heat producing component, the second surface for thermally contacting the heat absorbing component, such that the first thermal transfer fluid is in thermal contact with the first and second surfaces, the first composite substrate comprising an assembly of formed elements, further comprising:
   a first thermal transfer fluid contained within the first channel, whereby rotation of the first electrically conductive rotatable impeller by moving external magnetic fields impels the first thermal transfer fluid to circulate through the first channel, and heat from the heat producing component is transferred through the first surface into the first thermal transfer fluid, and heat from the first thermal transfer fluid is transferred through the second surface into the heat absorbing component.

3. The apparatus as in claim 2, wherein the exterior shape of the first composite substrate is characteristic of a plate.

4. The apparatus as in claim 2, wherein the first and second surfaces are approximately planar.

5. The apparatus as in claim 4, wherein the first and second surfaces are approximately coplanar.

6. The apparatus as in claim 5, wherein the first and second surfaces are contiguous.

7. The apparatus as in claim 4, wherein the normals to the first and second surfaces are approximately perpendicular.

8. The apparatus as in claim 4, wherein the normals to the first and second surfaces are approximately anti-parallel.

9. The apparatus as in claim 2, wherein the area of the first surface contacting the heat producing object is very much less than the area of the second surface contacting the heat absorbing object.

10. The apparatus as in claim 9, wherein the area of the first surface contacting the heat producing object is 80 times less than the area of the second surface contacting the heat absorbing object.

11. The apparatus as in claim 2, wherein the first composite substrate contains a plurality of channels, each of the plurality of channels being in fluid communication with each other of the plurality of channels.

12. The apparatus as in claim 2, wherein the heat absorbing component has a first face and a second face, the first and second faces being non-coplanar, the second surface of the first composite substrate for thermally contacting the first face of the heat absorbing component, further comprising:
   a) a second composite substrate having a surface, the surface of the second composite substrate for thermally contacting the second face of the heat absorbing component, the second composite substrate having a second channel for fluid flow in the interior of the second composite substrate, the second channel being in thermal contact with the surface of the second composite substrate; and
   b) a plurality of conduits hermetically attached to both the first and the second composite substrates, and flowably connecting the first and the second channels, and containing the first thermal transfer fluid, whereby rotation of the first electrically conductive rotatable impeller by externally generated moving magnetic fields impels the first thermal transfer fluid to circulate through the first channel in the first composite substrate, so that heat from the heat producing component is transferred through the first surface into the first thermal transfer fluid, and heat from the first thermal transfer fluid is transferred through the second surface of the first composite substrate through the first face of the heat absorbing component into the heat absorbing component, and whereby the rotation of the first electrically conductive rotatable impeller by externally generated moving magnetic fields impels the first thermal transfer fluid to circulate through the plurality of conduits and through the second channel in the second composite substrate, so that heat from the heat producing component is transferred through the first surface into the first thermal transfer fluid, and heat from the first thermal transfer fluid is transferred through the surface of the second composite substrate through the second face of the heat absorbing component into the heat absorbing component.

13. The apparatus as in claim 2, wherein a first fin means contained within the first composite substrate and in intimate contact with the first thermal fluid is in thermal contact with the first surface.

14. The apparatus as in claim 2, wherein the heat absorbing component is a second fin means.

15. The apparatus as in claim 14, wherein a second thermal transfer fluid external to the first composite substrate is impelled to pass in thermal contact with the second fin means.

16. The apparatus as in claim 16, further comprising:
   a) a motor; and
   b) a second impeller, wherein the motor means rotates the second impeller external to the first composite substrate, whereby the rotation of the second impeller motivates the flow of the second thermal transfer fluid to pass in thermal contact with the second fin means.

17. The apparatus as in claim 16, wherein the motor means generates the externally generated moving magnetic field that rotates the first electrically conductive rotatable impeller.

18. The apparatus as in claim 2, wherein the first electrically conductive rotatable impeller is located with respect to the first composite substrate with a rotatable bearing.

19. The apparatus as in claim 2, wherein the first electrically conductive rotatable impeller forms a portion of a centripetal pump.

20. The apparatus as in claim 2, wherein the first electrically conductive rotatable impeller forms a portion of a displacement pump.

21. The apparatus as in claim 2, wherein the first electrically conductive rotatable impeller forms a portion of a viscosity pump.

22. The apparatus as in claim 2, wherein a portion of the first electrically conductive rotatable impeller is copper.

23. The apparatus as in claim 2, wherein the first thermal transfer fluid is a metal which is liquid under normal operating conditions for the apparatus.

24. The apparatus as in claim 23, wherein the first thermal transfer fluid contains at least one of the following elements: aluminum, bismuth, cadmium, gallium, indium, lead, mercury, potassium, sodium, and tin.

25. The apparatus as in claim 2, wherein the first thermal transfer fluid contains at least one of the following liquids: water, ethylene glycol, methyl alcohol, ethyl alcohol, and trichloroethylene.

26. The apparatus as in claim 2, wherein a portion of the first channel contains a gas which compensates for differences in thermal expansion coefficients between the first composite substrate and the first thermal fluid.

27. The apparatus as in claim 26, wherein the gas is contained in a deformable bladder.

28. The apparatus as in claim 2, wherein the first composite substrate is sufficiently deformable so as to compensate for differences in thermal expansion between the composite substrate and the first fluid by perturbing the exterior shape of the composite substrate.

29. The apparatus as in claim 1, wherein the first composite substrate has a first and a second surface, the first surface for thermally contacting the heat producing component, the second surface for thermally contacting the heat absorbing component, such that the first thermal transfer fluid thermally contacts the first and second surfaces, further comprising:

a flexure means consisting of an attachment feature and a flexible feature, the attachment feature of the flexure means affixed to the first composite substrate, the flexible feature of the flexure means extending into the closed interior channel, a portion of the flexible feature consisting of permanently magnetized material, whereby externally generated oscillatory magnetic fields generate oscillatory deflections of the flexible feature of the flexure means within the closed interior channel, such that the oscillatory deflections of the flexible feature impels the first thermal transfer fluid to circulate through the closed interior channel, and heat from the heat producing component is transferred through the first surface into the electrically conductive first thermal transfer fluid, and heat from the electrically conductive first thermal transfer fluid is transferred through the second surface into the heat absorbing component.

30. An apparatus for transferring heat from a heat producing component to a heat absorbing component, comprising:

a) a composite substrate containing a closed interior channel for circulating a thermal transfer fluid, the composite substrate having a surface, the surface for thermally contacting the heat absorbing component, the heat producing component able to be located in the interior of the composite substrate so that the heat producing component is in thermal contact with the thermal transfer fluid, a portion of the heat producing component extending into the closed interior channel;

b) an electrically conductive rotatable fluid impeller contained in a portion of the closed interior channel, the externally generated moving magnetic fields inducing eddy currents in the impeller which interact with the externally generated moving magnetic fields to motivate the impeller to rotate; and c) a thermal transfer fluid contained within the closed interior channel, the thermal transfer fluid being in intimate contact with the portion of the heat producing component extending into the closed interior channel, whereby the rotation of the electrically conductive impeller by externally generated moving magnetic fields impels the thermal transfer fluid to circulate through the closed interior channel, and heat from the heat producing component is transferred into the thermal transfer fluid, and heat from the thermal transfer fluid is transferred through the second surface into the heat absorbing component.

31. The apparatus device as in claim 30, wherein the first thermal transfer fluid contains mineral oil.

32. An apparatus for transferring heat from a heat producing component to the atmosphere, comprising:

a) a composite substrate containing a closed interior channel for circulating a thermal transfer fluid, the composite substrate having a first and a second surface, the first surface for thermally contacting the heat producing component, and the second surface for thermally contacting the heat absorbing component, such that the thermal transfer fluid is in thermal contact with the first and second surfaces;

b) a first rotatable electrically conductive non-magnetic fluid impeller contained in a portion of the closed interior channel, the first impeller being motivated to rotate by externally generated moving magnetic fields;

c) a thermal transfer fluid contained within the closed interior channel;

d) a first fin means contained within the composite substrate, the first fin means thermally contacting the first surface, the thermal fluid being in intimate contact with the first fin means;

e) a second fin means external to the composite substrate and in thermal contact with the second surface, the atmosphere being in intimate contact with the second fin means;

f) a second rotatable fluid impeller external to the composite substrate capable of impelling the atmosphere to flow passed the second fin means; and g) a motor means that rotates the second impeller, which impels the atmosphere to flow passed the second fin means, the motor means also producing externally generated moving magnetic fields, whereby the rotation of the first impeller by externally generated moving magnetic fields impels the thermal transfer fluid to circulate through the closed interior channel, so that heat is transferred from the heat producing component through the first surface through the first fin means into the thermal transfer fluid, and heat from the thermal transfer fluid is transferred through the second surface through the second fin means into the atmosphere.

33. An apparatus for transferring heat from a heat producing component to the atmosphere, comprising:

a) a composite substrate containing a closed interior channel for circulating a thermal transfer fluid, the composite substrate having a first and a second surface, the first surface for thermally contacting the heat producing component, and the second surface for thermally contacting the heat absorbing component, such that the thermal transfer fluid is in thermal contact with the first and second surfaces;

b) a first rotatable electrically conductive non-magnetic fluid impeller contained in a portion of the closed interior channel, the first impeller being motivated to rotate by externally generated moving magnetic fields;

c) a thermal transfer fluid contained within the closed interior channel;

d) a fin means external to the composite substrate and in thermal contact with the second surface, the atmosphere being in intimate contact with the fin means;

e) a second rotatable fluid impeller external to the composite substrate capable of impelling the atmosphere to flow passed the fin means; and f) a motor means that rotates the second impeller, which impels the atmosphere to flow passed the fin means, the motor means also producing externally generated moving magnetic fields, whereby the rotation of the first impeller by externally generated moving magnetic fields impels the thermal transfer fluid to circulate through the closed interior channel, so that heat is transferred from the heat producing component through the first surface through the first fin means into the thermal transfer fluid, and heat from the thermal transfer fluid is transferred through the second surface through the second fin means into the atmosphere.

34. An apparatus for transferring heat from a heat producing component to the atmosphere through a fin means, the fin means having a first face and a second face which can both be thermally contacted, the first and second faces being non-coplanar, the atmosphere intimately contacting the fin means, comprising:

a) a first composite substrate containing a first interior channel for circulating a thermal transfer fluid, the first composite substrate having a first and a second surface, the first surface for thermally contacting the heat producing component, and the second surface for thermally contacting the first face of the fin means, such that the thermal transfer fluid is in thermal contact with the first and second surfaces;

b) a first rotatable electrically conductive non-magnetic fluid impeller contained in a portion of the first interior channel, the first impeller being motivated to rotate by externally generated moving magnetic fields;

c) a second composite substrate having a surface, the surface of the second composite substrate for thermally contacting the second face of the fin means, the second composite substrate containing a second interior channel for circulating a thermal transfer fluid, such that the thermal transfer fluid is in thermal contact with the surface of the second composite substrate;

d) a plurality of conduits hermetically attached to both the first and the second composite substrates, and flowably connecting the first and the second interior channels;

e) a thermal transfer fluid contained within the first interior channel, the second interior channel, and the plurality of conduits;

f) a second rotatable fluid impeller external to the first and second composite substrates capable of impelling the atmosphere to flow passed the fin means; and g) a motor means that rotates the second impeller, the motor means generating moving external magnetic fields, whereby the rotation of the first impeller by externally generated moving magnetic fields impels the thermal transfer fluid to circulate through the first closed interior channel in the first composite substrate, so that heat from the heat producing component is transferred through the first surface into the thermal transfer fluid, and heat from the thermal transfer fluid is transferred through the second surface of the first composite substrate through the first face of fin means into the fin means, and whereby the rotation of the first impeller by externally generated moving magnetic fields impels the thermal transfer fluid to circulate through the plurality of conduits and through the second closed interior channel in the second composite substrate, so that heat from the heat producing component is transferred through the first surface into the thermal transfer fluid, and heat from the thermal transfer fluid is transferred through the surface of the second composite substrate through the second face of the fin means into fin means, and whereby the rotation of the second impeller impels atmosphere to pass through the fin means, transferring heat from the fin means into the atmosphere.

35. An apparatus for transferring heat from a heat producing component to the atmosphere, comprising:

a) a fin means having a face which can be thermally contacted, the atmosphere being in intimate contact with the fin means;

b) a composite substrate containing a closed interior channel for circulating a thermal transfer fluid, the composite substrate having a first and a second surface, the first surface for thermally contacting the heat producing component, and the second surface for thermally contacting the face of the fin means, such that the thermal transfer fluid is in thermal contact with the first and second surfaces;

c) a first permanently magnetized rotatable fluid impeller contained in a portion of the closed interior channel, the first impeller being motivated to rotate by externally generated moving magnetic fields;

d) a thermal transfer fluid contained within the closed interior channel;

e) a second rotatable fluid impeller external to the composite substrate capable of impelling the atmosphere to flow in thermal contact with the fin means; and f) a motor means that rotates the second impeller, the motor means also producing externally generated moving magnetic fields, whereby the rotation of the first impeller by externally generated moving magnetic fields impels the thermal transfer fluid to continuously circulate through the closed interior channel, and heat from the heat producing component is transferred through the first surface into the first thermal transfer fluid, and heat from the first thermal transfer fluid is transferred through the second surface into the fin means, and whereby rotation of the second impeller motivates atmosphere to pass in thermal contact with the fin means, and heat from the fin means is transferred into the atmosphere.

* * * * *